United States Patent [19]
Roza

[11] Patent Number: 5,272,655
[45] Date of Patent: Dec. 21, 1993

[54] SAMPLE RATE CONVERTING FILTER

[75] Inventor: Engel Roza, Eindhoven, Netherlands

[73] Assignee: U.S. Philips Corporation, New York, N.Y.

[21] Appl. No.: 883,757

[22] Filed: May 15, 1992

[30] Foreign Application Priority Data

May 29, 1991 [EP] European Pat. Off. ............ 91201278

[51] Int. Cl.⁵ .............................................. G06F 15/31
[52] U.S. Cl. .............................. 364/724.1; 364/724.2
[58] Field of Search ........... 364/724.1, 724.01, 724.19, 364/724.2

[56] References Cited

U.S. PATENT DOCUMENTS 4,972,357  11/1990  Morel ............................... 364/724.1

FOREIGN PATENT DOCUMENTS 61-100015  5/1986  Japan .............................. 364/724.1
61-192113  8/1986  Japan .............................. 364/724.1

OTHER PUBLICATIONS

"Area-Efficient Multichannel Oversampled PCM Voice-Band Coder", by Leung et al., IEE Journal of Solid-State Circuits, vol. 23, No. 6, Dec. 1988, pp. 1351-1357.
"Multirate Digital Signal Processing", by Ronald E. Crochiere et al., Prentice Hall, pp. 31-39, 1983.

Primary Examiner—Long T. Nguyen
Attorney, Agent, or Firm—Jack D. Slobod

[57] ABSTRACT

A sample rate converter is formed by a cascade configuration of a partial filter (20,22,32,26,28) and an equalizer (26,28,30,34) for equalizing the frequency characteristic of the partial filter. For obtaining a minimum-complexity equalizer when the complexity of the partial filter is minimized, the equalizer is arranged as a feedback system including in the feedback path an equalization filter that is substantially equal to the partial filter.

16 Claims, 2 Drawing Sheets

SAMPLE RATE CONVERTING FILTER

BACKGROUND OF THE INVENTION

1. Field of the Invention

The invention relates to a sample rate converter for filtering a discrete-time input signal having a sample rate $q \cdot f_s$ by means of a system filter having an impulse response h(t) and, besides, for converting the discrete-time input signal having a sample rate $q \cdot f_s$ to a discrete-time output signal having a sample rate $p \cdot f_s$, p and q being unequal positive integers greater than or equal to one, the sample rate converter including a cascade combination of a partial filter and an equalizer for equalizing the frequency characteristic of the sample rate converter.

2. Description of the Related Art

A sample rate converter of this type is known from the journal article entitled "Area-Efficient Multichannel Oversampled PCM Voiceband Coder" in IEEE Journal of Solid State Circuits, Vol. 23, No. 6, December 1988.

Sample rate converters of this type are used, for example, in analog-to-digital converters and digital-to-analog converters operating according to the sigma-delta principle. In a sigma-delta analog-to-digital converter the analog input signal is converted to a digital 1-bit signal that denotes the sign of the difference between a sample of the analog input signal and a sample of suitably filtered preceding 1-bit signals.

The sample rate of the sigma-delta analog-to-digital converter is many times higher than the minimum required sample rate according to Shannon's sampling theorem. The advantage of this is that the anti-aliasing filter which is to reduce the bandwidth of the analog input signal to half the sample rate may now be arranged in a much simpler manner in that the passband and the stopband of this anti-aliasing filter are much wider apart than in the case where the sample rate were about equal to the minimum sample rate required according to the sampling theorem.

However, in many cases a digital output signal is ultimately desired to have a sample rate which is about equal to the minimum sample rate required according to the sampling theorem. This lower sample rate is often desired for further processing the, for example, digital output signal with the aid of a bit-parallel arranged signal processor which, in addition, has a limited processing rate. Also for the transmission of such a signal by, for example, a telephone line, the sample rate of the digital signal is desired not to be higher than is strictly necessary.

For obtaining a reduction of the sample rate, the 1-bit signal is applied to a sample rate converter which derives a reduced sample rate PCM signal from the 1-bit signal.

A known property (known, for example, from aforementioned article) of sigma-delta modulators is that the 1-bit signal comprises quantizing noise with a frequency-dependent spectral power density, which spectral power density strongly increases with frequency. If the conversion of the 1-bit signal to a PCM signal having a reduced sample rate is effected, for example, by adding bits over a specific time interval, the high-frequency quantizing noise in the 1-bit signal will be aliased to the baseband in which the desired signal is situated. Consequently, the signal-to-noise ratio of the PCM signal is degraded considerably.

In order to avoid this degradation of the signal-to-noise ratio, the noise of the 1-bit signal, which noise has frequencies exceeding the maximum frequency of the desired PCM signal, is to be eliminated with the aid of a filter to be termed rest filter hereinafter, before the sample rate is reduced.

A similar problem occurs when the sample rate is increased from a first sample rate $f_1$ to a second sample rate $f_2$. Once the sample rate has been increased, the frequency spectrum of the discrete-time signal having the second sample rate continues to be periodic with a period $f_1$ that corresponds to the first sample rate, whereas a signal is desired which has a frequency spectrum that is only periodic with a period $f_2$ that corresponds to the second (higher) sample rate. In order to realise this, a system filter is required which also eliminates the undesired frequency components between $\frac{1}{2} f_1$ and $\frac{1}{2} f_2$.

For a reduction of the complexity of the system filter, a system filter having an impulse response h(t) which is simple to realize is chosen for the known sample rate converter. As a result, the frequency characteristic of the system filter in the passband is not flat, so that the frequency spectrum of the baseband signal will change. In order to realize a flat frequency characteristic in the passband of the whole sample rate converter, the sample rate converter is arranged as a cascade configuration of a partial filter and an equalizer, while the whole system filter or part thereof is incorporated in the partial filter.

Although the use of a partial filter and an equalizer leads to some reduction of the complexity of the sample rate converter, the need for reducing this complexity still continues to exist.

SUMMARY OF THE INVENTION

It is an object of the invention to provide a sample rate converter mentioned in the opening paragraph, whose complexity is further reduced.

For this purpose, the sample rate converter is characterized, in that the input of the equalizer is coupled to a first input of combining means, in that an output of the combining means is coupled to the input of a feedforward path and in that the output of the feedforward path is coupled to the output of the equalizer and, by way of the equalization filter, to a second input of the combining means.

By arranging the equalizer as a feedback system which comprises an equalization filter in the feedback path, there is achieved that the partial filter and the equalization filter show a strong resemblance. Hereinbelow it will be shown that the partial filter and the equalization filter show such a strong resemblance that a minimization of the complexity of the partial filter likewise leads to a minimization of the complexity of the equalizer.

Let it be assumed that the partial filter has a transfer $H_{sys}$, the transfer of the equalizer $H_{eg}$ is to be equal to:

$$H_{eg} = \frac{1}{H_{sys}} \quad (1)$$

Assuming further that the combining means comprise an adder, and that the transfer of the feedforward path is equal to 1, for $H_{eg}$ may then be written:

$$H_{eg} = \frac{1}{1 - H_{egf}} \quad (2)$$

In (2) $H_{egf}$ is the transfer function of the equalization filter. Let (1) and (2) be equal, then:

From (3) it now follows that $H_{egf}$ and $H_{sys}$ indeed show a strong $$H_{egf} = 1 - H_{sys} \quad (3)$$

resemblance.

An embodiment of the invention is characterized, in that the function $h(t_1+t_2)(t_1,t_2 \geq 0)$ equals $g(t_1) \cdot h(t_2)$, in that a delay element having a delay $1/f_s$ is present between the output of the partial filter and the input of the equalizer, in that the input sample rate of the partial filter is equal to $q \cdot f_s$, in that the output sample rate of the partial filter is equal to $f_s$, in that the input sample rate of the equalization filter is equal to $p \cdot f_s$, in that the output sample rate of the equalization filter is equal to $f_s$, in that the feedforward path comprises a rest filter having an input sample rate $f_s$ and an output sample rate $f_s$ and summing transforming means having an input sample rate $f_s$ and an output sample rate $p \cdot f_s$, the input of the feedforward path being coupled by way of the rest filter to a first input of the summing transforming means, in that the output of the partial filter is coupled to a second input of the summing transforming means and in that an output of the summing transforming means is coupled to the output of the feedforward path.

In this embodiment part of the partial filter and a corresponding part of the equalization filter are included in the feedforward path of the equalizer by way of the rest filter, so that part of the partial filter and the equalizer are combined resulting in a still further reduction of the complexity of the sample rate converter. Hereinbelow there will be explained that part of the partial filter and part of the equalizer may be combined to form the rest filter.

Let $1/f_s$ be equal to T and the input signal consist of samples $a_n$ having a sample rate $q \cdot f_s$, there may then be derived for the response $y_1$ at instants $jT$ of a system having impulse response $h(t)$ to these samples:

$$y_1 = \sum_{n=1}^{jq} a_n \cdot h\left(jT - \frac{nT}{q}\right) \quad (4)$$

For the response $y_2$ at instants $jT$ of the system having impulse response $h(t)$ to samples $b_k$ having the sample rate $p \cdot f_s$, there may be derived:

$$y_2 = \sum_{k=1}^{jp} b_k \cdot h\left(jT - \frac{kT}{p}\right) \quad (5)$$

From (4) and (5) there may be derived for $y_1$ and $y_2$:

$$y_1 = \sum_{n=1}^{q} a_n \cdot h\left(jT - \frac{nT}{q}\right) + \quad (6)$$

$$\sum_{n=1}^{q} a_{n+q} \cdot h\left((j-1)T - \frac{nT}{q}\right) + \ldots +$$

$$\sum_{n=1}^{q} a_{q(j-1)+n} \cdot h\left(T - \frac{nT}{q}\right)$$

$$y_2 = \sum_{k=1}^{p} b_k \cdot h\left(jT - \frac{kT}{p}\right) + \quad (7)$$

$$\sum_{k=1}^{p} b_{k+p} \cdot h\left((j-1)T - \frac{kT}{p}\right) + \ldots +$$

$$\sum_{k=1}^{p} b_{p(j-1)+k} \cdot h\left(T - \frac{kT}{p}\right)$$

If the samples $a_n$ and $b_k$ are representative of the same signal, $y_1(jT)$ and $y_2(jT)$ are to be equal. By utilizing this equality as well as the property of $h(t_1+t_2) = g(t_1) \cdot h(t_2)(=g(t_2) \cdot h(t_1))$, where f is independent of $t_2$ and g is independent of $t_1$, it follows from (6) and (7):

$$h(0) \sum_{k=1}^{p} b_{p(j-1)+k} \cdot g\left(T - \frac{kT}{p}\right) = h(0) \sum_{n=1}^{q} a_{q(j-1)+n} \cdot g\left(T - \frac{nT}{q}\right) + \quad (8)$$

$$+ h(T) \left[ \sum_{n=1}^{q} a_{q(j-2)+n} \cdot g\left(T - \frac{nT}{q}\right) - \sum_{k=1}^{p} b_{p(j-2)+k} \cdot g\left(T - \frac{kT}{p}\right) \right]$$

$$h(2T) \left[ \sum_{n=1}^{q} a_{q(j-3)+n} \cdot g\left(T - \frac{nT}{q}\right) - \sum_{k=1}^{p} b_{p(j-3)+k} \cdot g\left(T - \frac{kT}{p}\right) \right] + \ldots$$

(8) may also be written as:

$$h(0) \sum_{k=1}^{p} b_{p(j-1)+k} \cdot g\left(T - \frac{kT}{p}\right) = \quad (9)$$

$$h(0) \sum_{n=1}^{q} a_{q(j-1)+n} \cdot g\left(T - \frac{nT}{q}\right) + S_{j-1}$$

In (9) it holds for $S_{j-1}$:

$$S_{j-1} = h(T) \left[ \sum_{n=1}^{q} a_{q(j-2)+n} \cdot g\left(T - \frac{nT}{q}\right) - \quad (10) \right.$$

$$\left. \sum_{k=1}^{p} b_{p(j-2)+k} \cdot g\left(T - \frac{kT}{p}\right) \right] +$$

$$h(2T)\left[\sum_{n=1}^{q} a_{q(j-3)+n} \cdot g\left(T - \frac{nT}{q}\right) - \sum_{k=1}^{p} b_{p(j-3)+k} \cdot g\left(T - \frac{kT}{p}\right)\right] + \ldots$$

For $S_{j-1}$ the following recurrent relationship may be derived:

$$s_{j-1} = g(T)\left\{h(0)\left[\sum_{n=1}^{q} a_{q(j-2)+n} \cdot g\left(T - \frac{nT}{q}\right) - \sum_{k=1}^{p} b_{p(j-2)+k} \cdot g\left(T - \frac{kT}{p}\right)\right] + S_{j-2}\right\} \quad (11)$$

The sum of the samples $a_n$, which sum is weighted by the function g, is determined by means of the partial filter. The sum of the samples $b_k$, which sum is weighted by the function g, is determined by the equalization filter, whereas the rest filter recursively determines $S_{j-1}$.

The summing transforming means determine the sum of the output signals of the rest filter and the partial filter. Furthermore, the summing transforming means transform this sum into a suitable sequence of samples $b_k$ for which it holds in the best way possible that the sum weighted by a function g is equal to the sum of the two input signals of the summing transforming means.

If the impulse response h(0) is equal to 0, a singularity arises in formula (9) because various factors are multiplied by 0. If h(0) is equal to 0, there may be derived for the samples $b_{p(j-1)+k}$:

$$h(T)\sum_{k=1}^{p} b_{p(j-1)+k} \cdot g\left(T - \frac{kT}{p}\right) = \quad (12)$$

$$h(T)\sum_{n=1}^{q} a_{q(j-1)+n} \cdot g\left(T - \frac{nT}{q}\right) + S_{j-2}$$

with $$S_{j-2} = g(T)\left\{f(T)\left[\sum_{n=1}^{q} a_{q(j-3)+n} \cdot g\left(T - \frac{nT}{q}\right) - \sum_{k=1}^{p} b_{p(j-3)+k} \cdot g\left(T - \frac{kT}{p}\right)\right] + S_{j-3}\right\} \quad (13)$$

A further embodiment of the invention is characterized, in that the sample rate converter further comprises at least one combination which includes a further partial filter, a further delay element, further combining means, a further equalization filter and a further rest filter, in that the input of the further partial filter is coupled to the input of the sample rate converter, in that the output of the further partial filter is coupled to a first of an additional pair of inputs of the summing transforming means and coupled, by way of the further delay element, to a first input of the further combining means, in that the output of the summing transforming means is coupled to the second input of the further combining means by way of the further equalization filter, and in that the output of the further combining means is coupled to the second of the additional pair of inputs of the summing transforming means by way of the further rest filter.

In this embodiment a plurality of equivalent sections is added to the sample rate converter. This is advantageous in that a system filter may be obtained having a steeper filter curve. This is often necessary for sufficiently suppressing noise in the input signal, for example, noise coming from aforementioned sigma-delta modulator.

A further embodiment of the invention is characterized, in that the partial filter comprises in addition to first Table means a serial-to-parallel converter for converting q serial input samples to q parallel output samples, in that the input of the partial filter is coupled to the input of the serial-to-parallel converter, in that the q outputs of the serial-to-parallel converter are coupled to q inputs of the first Table means and in that an output of the Table means is coupled to the output of the partial filter.

These measures provide a simple embodiment for the partial filter while only the serial-to-parallel converter operates at a high frequency.

A further embodiment of the invention is characterized, in that the impulse response of the combination formed by the partial filter and the rest filter and also the impulse response of the combination formed by the equalization filter and the rest filter comprises at least an exponential function.

An exponential function is a function that can be implemented in a simple manner and has the property of $h(t_1 + t_2) = g(t_1) \cdot h(t_2)$ for $t_1, t_2 \geq 0$.

A further embodiment of the invention is characterized, in that the ratio of two successive samples of the impulse response is a power of two.

As a result of this choice, multiplications necessary for determining the weighted sums may be replaced by much simpler shift operations which leads to a further reduction of the complexity of the sample rate converter.

A preferred embodiment of the invention is characterized, in that the combination of the partial filter and the rest filter comprises at least two imaginary zeros.

Since zeros are situated on the imaginary axis, zeros are developed in the frequency characteristic of the filter, so that the suppression of out-of-baseband signals is enhanced without a more complex circuit being necessary for this purpose.

BRIEF DESCRIPTION OF THE DRAWINGS

The invention will now be further explained with reference to the drawing Figures, in which like elements will be denoted by like reference characters, in which.

DETAILED DESCRIPTION OF THE PREFERRED EMBODIMENTS

Figure 1:
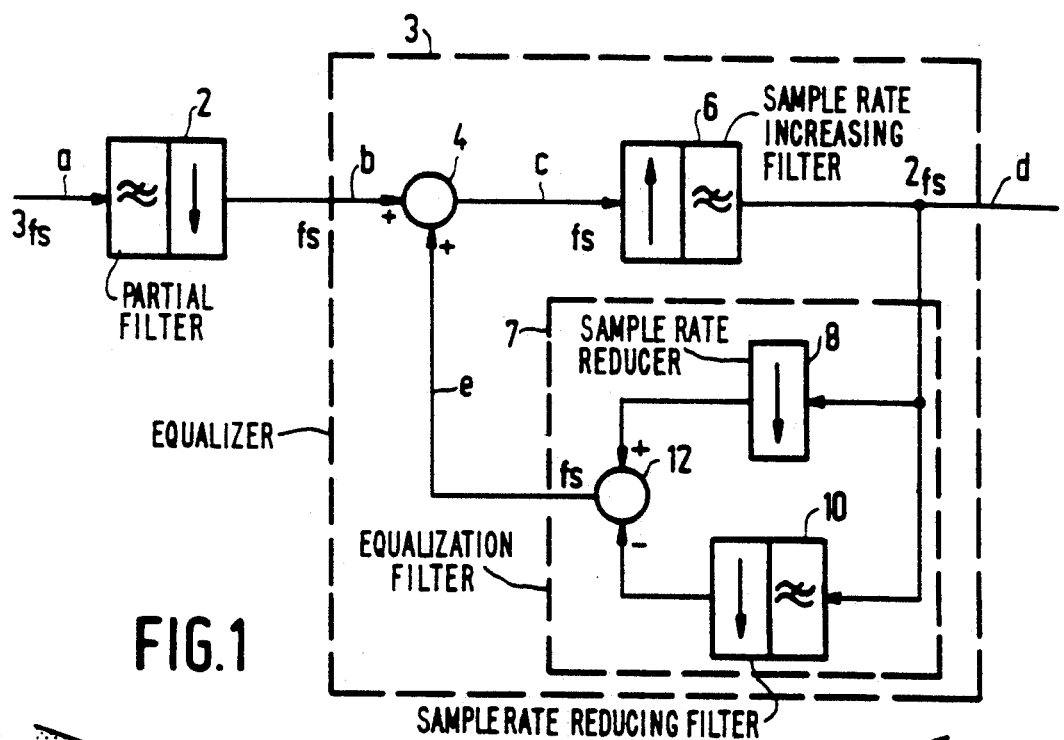
FIG. 1 shows a block diagram of a sample rate converter according to the invention.

In the sample rate converter as shown in FIG. 1 a partial filter 2 is supplied with an input signal a having a sample rate $q \cdot f_s$, where q equals 3. The output of the partial filter 2 is connected to the input of an equalizer 3.

The input of the equalizer 3 is formed by a first input of combining means constituted in this case by an adder 4. The output of the adder 4 is connected to the input of the feedforward path in this case formed by a sample rate increasing filter 6. The output of the sample rate increasing filter 6 forms the output of the sample rate converter. The output of the sample rate increasing filter 6 is connected to a second input of the adder 4 by way of an equalization filter 7. The input of the equalization filter 7 is connected to the input of a sample rate reducer 8 and to the input of a sample rate reducing filter 10. The output of the sample rate reducer 8 is connected to a first input of a subtractor 12, the output of the sample rate reducing filter being connected to a second input of the subtractor 12. The output of the subtractor 12 likewise forms the output of the equalization filter 7.

The input signal a, having sample rate $3f_s$, is filtered in the sample rate reducing filter 2 having a low-pass characteristic and its sample rate is reduced by a factor of 3. The output signal of the sample rate reducing filter 2 is filtered in the equalizer 3 so that the effect of the filter 2 on the frequency spectrum of the desired part of the input signal is compensated. In addition, the equalizer 3, increases the sample rate by a factor of 2. The compensation of the low-pass character of filter 2 is effected by the equalization filter 7 in the equalizer. According to the inventive idea, this filter has a transfer function equal to:

$$H_{eqf} = 1 - H_{sys} \qquad (3)$$

This transfer function is realized according to the inventive idea by subtracting the output signal of the sample rate reducing filter 10, having transfer $H_{sys}$, from the output signal of the sample rate reducer 8 having a transfer function equal to 1.

The sample rate increasing filter 6 increases the sample rate of its input signal by a factor of 2 and likewise provides that spectral components in the input signal situated between $\frac{1}{2} f_s$ and $f_s$ are eliminated. The latter will be further explained with reference to the FIGS. 2a to 2d.

Figure 2A:
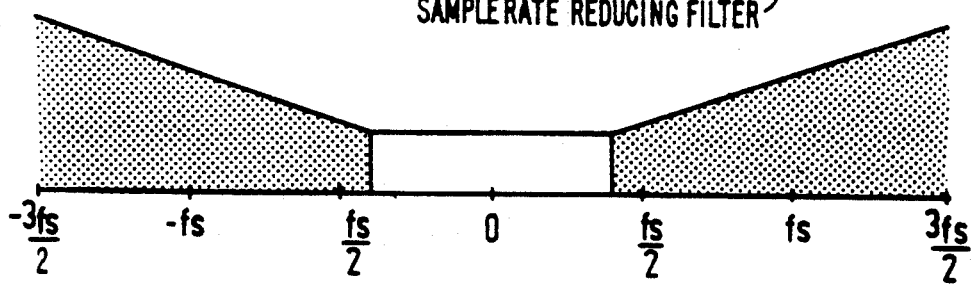
FIGS. 2a through 2e show frequency spectrums of various signals as they may occur in a sample rate converter as shown in FIG. 1 at points a through e, respectively.
Figure 2B:
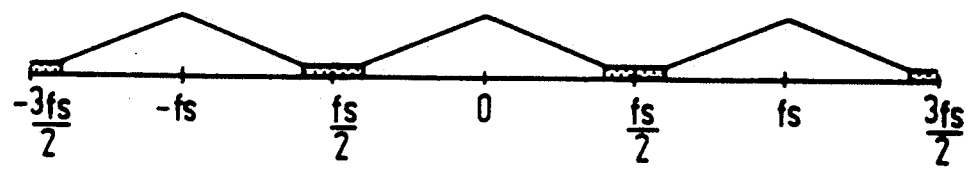
Figure 2C:
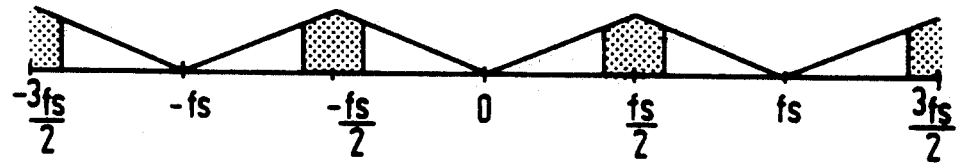
Figure 2D:
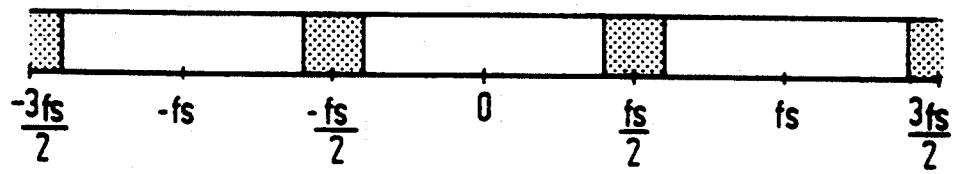
Figure 2E:
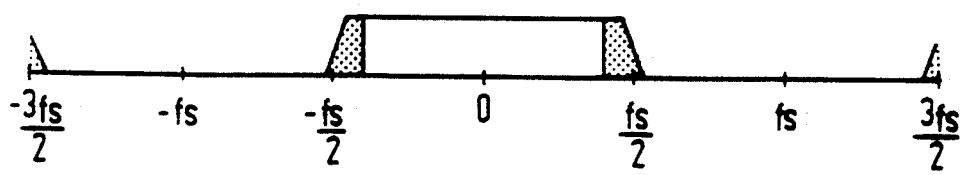

FIG. 2a shows the spectrum of an input signal a of the sample rate converter. This spectrum may be divided into two frequency ranges, i.e. the frequency range accommodating the desired signals and the frequency range accommodating the undesired signals. The latter range is shown in grey. At the output of the sample rate reducing filter 2 the spectrum shown in FIG. 2b is present. From this drawing Figure it may be noticed that the cut-off frequency (for example, the 3 dB point) of the filter 2 is much lower than the maximum frequency occurring in the signal a. In addition, it may be noticed that the frequency spectrum is periodic with a rate $f_s$ due to the reduction of the sample rate. Furthermore, it may be noticed that the undesired signal components exhibit a much stronger attenuation than the desired signal components.

The influence of a change of the sample rate on the frequency spectrum of a sampled signal is described, for example, in the title of "Multirate Digital Signal Processing" by R. E. Crochiere and L. R. Rabiner, published by Prentice-Hall (1983), ISBN 0-13-605162-6.

If it is assumed that the frequency spectrum of the output signal d in the interval between $-f_s$ and $f_s$ is to be equal to the desired part of the input signal a between $-f_s$ and $f_s$, the frequency spectrum of the signal e may be determined in a simple fashion. This frequency spectrum displays a high-pass characteristic and is furthermore periodic with a rate $f_s$. The frequency spectrum of signal c is now found by adding the frequency spectrums of the signals b and e together. The frequency spectrum of signal c is now flat, but is still periodic with a rate $f_s$. The sample rate increasing filter 6 eliminates the frequency components situated between $\frac{1}{2} f_s$ and $f_s$, so that the desired output signal d is obtained. From the frequency spectrum of the signal d it is clearly noticeable that the undesired components in the signal d are strongly reduced.

If the bandwidth of the desired part of the signal a exceeds $f_s/2$, the sample rate conversion may not be effected in the manner described hereinbefore, because the desired part of the output signal b of the partial filter then no longer satisfies the sampling theorem.

In that case the equalizer and the partial filter have to change places, so that the sample rate is first increased by the equalizer and then reduced by the partial filter. Because the signal processing is now to take place at a higher frequency, the sample rate converter will generally be more complex.

Figure 3:
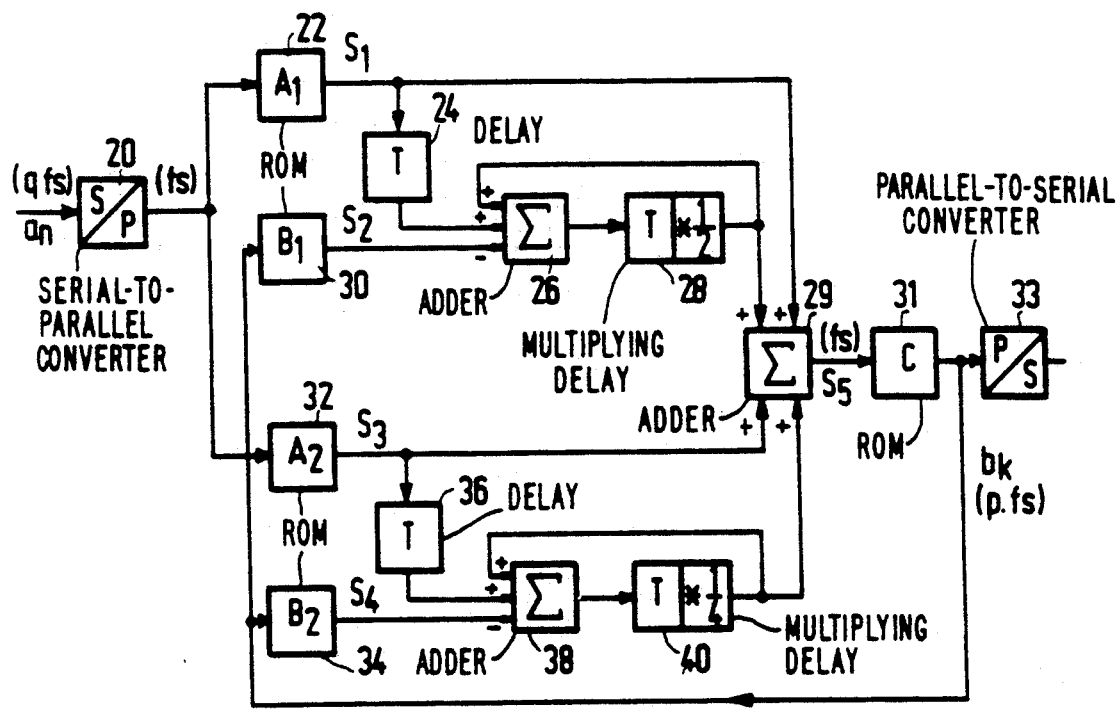
FIG. 3 shows an embodiment of the sample rate converter according to the invention.

In the sample rate converter as shown in FIG. 3 the input signal is applied to a serial-to-parallel converter 20. The output of the serial-to-parallel converter 20 is connected to an input of first Table means formed in this case by a ROM 22 (32). The combination of serial-to-parallel converter 20 and ROM 22 (32) forms the partial filter (further partial filter). The output of the ROM 22 (32) is connected to an input of a delay element 24 (36) and to a first and a second input respectively, of an adder 29.

The output of the delay element 24 (36) is connected to a first input of an adder 26 (38). The output of the adder 26 (38) is connected to the input of a multiplying delay element 28 (40). The output of the multiplying delay element 28 (40) is connected to a second input of the adder 26 (38) and to a third and fourth input respectively, of the adder 29. A combination of adder 26 (38) and the multiplying delay element 28 (40) forms the rest filter (further rest filter).

The output of the adder 29 is connected to a ROM 31 which produces parallel output samples for each input sample q. The adder 29 and the ROM 31 form the summing transforming means. The outputs of the ROM 31 are connected to inputs of a parallel-to-serial converter 33 and to inputs of second Table means, a ROM 30 (34) in this case. The output of the ROM 30 (34) is connected to a negative input of the adder 26 (38). The ROM 30 and the ROM 34 form the equalization filter and the further equalization filter respectively.

In the sample rate converter as shown in FIG. 3 the serial-to-parallel converter 20 converts q input samples to a word of p parallel output samples. These parallel output samples are converted to a single output sample by way of the ROM 22 (32). The number of values the input samples may assume is limited to $2^p$, due to which also the number of different input words of the ROM 22 or 31 respectively, will be limited. If the input symbols of the serial-to-parallel converter are equal to $a_n$, the ROM 22 generates the sum of q successive input samples weighted by the function g(t). In the serial-to-parallel converter as shown in FIG. 3 the impulse response h(t) is equal to a sum of exponential functions of time in which each exponential function is realized by its own partial filter and rest filter. In the example shown in FIG. 3 the impulse response is equal to:

$$h(t) = \left(\frac{1}{2}\right)^{\frac{t}{T}} + \left(\frac{1}{4}\right)^{\frac{t}{T}} \quad (15)$$

For the output signal $S_1$ of ROM 22 then holds:

$$S_1(j) = \sum_{n=1}^{q} a_{q(j-1)+n} \cdot \left(\frac{1}{2}\right)^{(1-\frac{n}{q})} \quad (16)$$

For the output signal $S_3$ of ROM 32 then holds:

$$S_3(j) = \sum_{n=1}^{q} a_{q(j-1)+n} \cdot \left(\frac{1}{4}\right)^{(1-\frac{n}{q})} \quad (17)$$

The rest filter constituted by the adder 26 and the delay element 28 has an impulse response $h(t)=(\frac{1}{2})^{t/T}$ and the further rest filter constituted by adder 38 and delay element 40 has an impulse response $h(t)=(\frac{1}{4})^{t/T}$.

The adder 29 now determines the total response of the various sub-responses. The ROM 31 determines p output samples on the basis of the single samples at its input, the response of the system filter to the p output samples matching the input sample in the best way possible. For the relation between input samples and output samples of the ROM 31 the following is to hold:

$$\sum_{k=1}^{p} b_{p(j-1)+k} \cdot \left[\left(\frac{1}{2}\right)^{(1-\frac{k}{p})} + \left(\frac{1}{4}\right)^{(1-\frac{k}{p})}\right] = S_5 \quad (18)$$

On the basis of formula (18) the contents of ROM 31 may be determined in a simple manner.

The number of possible values that can be assumed by the output samples is always limited. This means that a number of values of the input samples of the ROM 31 are represented by the same output sample. In that case the input samples of ROM 31 are quantized to the number of possible values for which (18) holds exactly. Hereinbelow, an example of this quantization and the associated relation between the input signals and output signals of the ROM 31 will be given for p equal to 3 and the number of possible values of the input samples of ROM 31 equal to 2(+1 and −1).

| $b_1$ | $b_2$ | $b_3$ | $S_5$ v[16] | $S_5$ |
|---|---|---|---|---|
| −1 | −1 | −1 | −4.45 | $S_5 \leq -3.42$ |
| 1 | −1 | −1 | −2.40 | $-3.42 < S_5 \leq -2.00$ |
| −1 | 1 | −1 | −1.60 | $-2.00 < S_5 \leq -1.03$ |
| −1 | −1 | 1 | −0.45 | $-1.03 < S_5 \leq 0$ |
| 1 | 1 | −1 | 0.45 | $0 < S_5 \leq 1.03$ |
| 1 | −1 | 1 | 1.60 | $1.03 < S_5 \leq 2.00$ |
| −1 | 1 | 1 | 2.40 | $2.00 < S_5 \leq 3.42$ |
| 1 | 1 | 1 | 4.45 | $3.42 < S_5$ |

In this Table the fourth column shows for which values of $S_5$ formula (18) holds exactly. For different values of $S_5$ these values are quantized to the nearest value according to column 4. Column 5 denotes at which values of $S_5$ the various output samples $b_1, b_2$ and $b_3$ are generated. The parallel-to-serial converter 33 converts the parallel output signal of the ROM 31 to a serial output signal.

The equalization filter is arranged as parallel operating sections, as is the partial filter. The equalization filter constituted by the ROMs 30 and 34 determines on the basis of the q parallel output signals of ROM 31 the desired feedback signals which are applied to the rest filters.

The following holds for the output signal of the ROM 30:

$$S_2(j) = \sum_{k=1}^{p} b_{p(j-1)+k} \cdot \left(\frac{1}{2}\right)^{(1-\frac{k}{p})} \quad (19)$$

The output signal of ROM 34 is equal to:

$$S_4(j) = \sum_{k=1}^{p} b_{p(j-1)+k} \cdot \left(\frac{1}{4}\right)^{(1-\frac{k}{p})} \quad (20)$$

In the adder 29, the ROM 31 or in the ROMs 30 and 34 respectively, a multiplication by a factor of $\frac{1}{2}$ is still to be performed to determine the sum of the samples b which sum has been weighted by the function g, due to the multiplication by h(0) (=2) in formula (9).

A first particular situation occurs if q=1 with p≠1.

In this situation the ROM 31 and the serial-to-parallel converter 33 may be omitted, so that the output signal of the adder 29 likewise forms the output signal of the sample rate converter. The ROM 30 and the ROM 31 then produce an output signal which depends on no more than a single input sample, which results in a simple embodiment. Furthermore, it can be noticed that except for the serial-to-parallel conversion at the input, all operations may be performed at the low output sample rate.

This situation occurs, for example, when there is a conversion from a 1-bit signal coming, for example, from a sigma-delta modulator, to a p-bit PCM signal. The system filter is then to suppress the quantization noise which enhances with increasing frequency, so that the system filter no longer has any influence on the sample rate converter output signal outside the baseband. In order to maintain the noise power caused by out-of-baseband noise of the sample rate converter output signal below a specific value N, the frequency characteristic of the system filter is to meet the following requirement:

$$\frac{1}{2\pi} \int_{\pi f_s}^{\infty} S_b(\omega) \cdot |H(\omega)|^2 \, d\omega \leq N \quad (21)$$

In (21) $S_b(\omega)$ is the quantization noise spectrum of the input signal of the sample rate converter and $|H(\omega)|^2$ is the squared absolute value of the transfer function of the system filter. (21) proves that a steep decline of the system filter past $f_s/2$ yields good noise suppression.

According to a preferred embodiment of the invention this may be realised without enhancing the complexity of the system filter by giving the transfer function two imaginary zeros while real poles are retained. In order to make this possible, the embodiment shown in FIG. 3 is to comprise at least 3 parallel filter sections, while one or two sections produce a negative output signal in the case of a positive input signal.

An example of an impulse response corresponding to such a transfer function is:

$$h(t) = \left(\frac{1}{2}\right)^{(\frac{t}{T})} - 1.8\left(\frac{1}{4}\right)^{(\frac{t}{T})} + \left(\frac{1}{8}\right)^{(\frac{t}{T})} \quad (22)$$

Figures 4A, 4B:
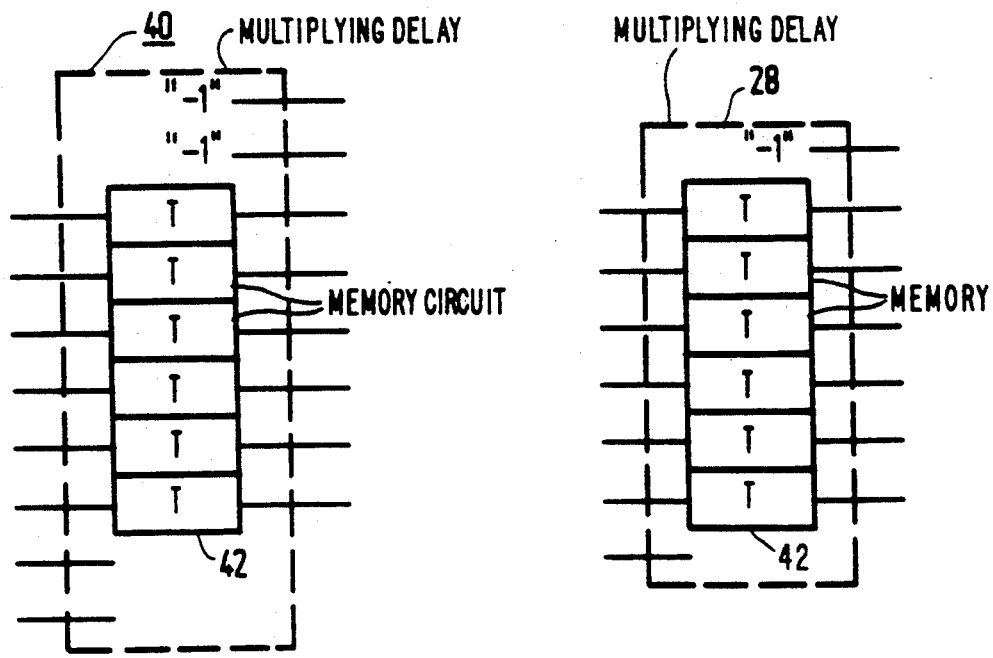
FIG. 4a shows a delay unit in which, besides, the input signal is multiplied by a factor of 0.25.
FIG. 4b shows a delay unit in which, besides, the input signal is multiplied by a factor of 0.5.

In FIG. 4a the multiplying delay circuit comprises a delay circuit in which all the bits except for the two least significant bits are transported to a memory circuit 42. The output bits of the memory circuit 42 are extended by two most significant bits having a logic value "−1". The effect of this is that the most significant bits are shifted two places to a less significant position, which narrows down to a multiplication by a factor of ¼. In the circuit as shown in FIG. 4b a shift by one bit position is realized in similar fashion, which narrows down to a multiplication by a factor of ½.

I claim:

1. Sample rate converter for filtering a discrete-time input signal having a sample rate $q \cdot f_s$ by means of a system filter and also for converting the discrete-time input signal having a sample rate $q \cdot f_s$ to a discrete-time output signal having a sample rate $p \cdot f_s$, p and q being unequal positive integers greater than or equal to one, the sample rate converter having an input an output, said sample rate converter comprising a cascade combination of a partial filter and an equalizer for equalizing the frequency characteristic of the sample rate converter, said partial filter and equalizer having respective inputs and outputs said cascade combination having an input coupled to the input of the sample converter and having an output coupled to the output of the sample rate converter, said equalizer comprising a combining means and a feedforward path having an input and an output. said combining means having a first input, a second input and an output, said first input being coupled to the input of the equalizer and said output of the combining means being coupled to the input of the feedforward path, the output of the feedforward path being coupled to the output of the equalizer and, by way of an equalization filter, to said second input.

2. Sample rate converter as claimed in claim 1, wherein a delay element having a delay $1/f_s$ is present between the output of the partial filter and the input of the equalizer, the partial filter has an input sample rate equal to $q \cdot f_s$ and an output sample rate equal to $f_s$, the equalization filter has an input sample rate equal to $p \cdot f_s$ and an output sample rate equal to $f_s$, the feedforward path comprises a rest filter, having an input sample rate $f_s$ and an output sample rate $f_s$, and summing transforming means having an input sample rate $f_s$ and an output sample rate $p \cdot f_s$ and having a first input, a second input and an output, the input of the feedforward path being coupled by way of the rest filter to the first input of the summing transforming means, the output of the partial filter being coupled to the second input of the summing transforming means and the output of the summing transforming means being coupled to the output of the feedforward path.

3. Sample rate converter as claimed in claim 2, wherein said summing transforming means has a third input and a fourth input and the sample rate converter further comprises at least one combination which includes a further partial filter, a further delay element, further combining means, a further equalization filter and a further rest filter, having respective inputs and outputs, the input of the further partial filter being coupled to the input of the sample rate converter, the output of the further partial filter being coupled to the third input of the summing transforming means and coupled, by way of the further delay element, to a first input of the further combining means, the output of the summing transforming means being coupled to a second input of the further combining means by way of the further equalization filter, and the output of the further combining means being coupled to the fourth input of the summing transforming means by way of the further rest filter.

4. Sample rate converter as claimed in claim 3, wherein the partial filter comprises first Table means, having q inputs and an output, a serial-to-parallel converter, having an input and q outputs, for converting q serial input samples to q parallel output samples, the input of the partial filter being coupled to the input of the serial-to-parallel converter, the q outputs of the serial-to-parallel converter being coupled to the q inputs of the first Table means, respectively, and the output of the first Table means being coupled to the output of the partial filter.

5. Sample rate converter as claimed in claim 4, wherein the equalization filter comprises a Table means having an input and an output, said equalization filter having an input and an output, the input of the equalization filter being coupled to the input of the Table means and the output of the Table means being coupled to the output of the equalization filter.

6. Sample rate converter as claimed in claim 5, wherein a first impulse response of a combination formed by the partial filter and the rest filter and a second impulse response of a combination formed by the equalization filter and the rest filter each comprises at least an exponential function.

7. Sample rate converter as claimed in claim 6, wherein, for each of the first and second impulse responses, a ratio of two consecutive samples of the impulse response is a power of two.

8. Sample rate converter as claimed in claim 7, wherein a combination of the partial filter and the rest filter has a transfer function including at least two imaginary zeros.

9. Sample rate converter as claimed in claim 3, wherein the equalization filter comprises a Table means having an input and an output, said equalization filter having an input and an output, the input of the equalization filter being coupled to the input of the Table means and the output of the second Table means being coupled to the output of the equalization filter.

10. Sample rate converter as claimed in claim 3, wherein a first impulse response of a combination formed by the partial filter and the rest filter and a second impulse response of a combination formed by the equalization filter and the rest filter each comprises at least an exponential function.

11. Sample rate converter as claimed in claim 2, wherein the partial filter comprises first Table means, having q inputs and an output, a serial-to-parallel converter, having an input and q outputs, for converting q serial input samples to q parallel output samples, the input of the partial filter being coupled to the input of the serial-to-parallel converter, the q outputs of the serial-to-parallel converter being coupled to the q inputs of the first Table means, respectively, and the output of the first Table means being coupled to the output of the partial filter.

12. Sample rate converter as claimed in claim 11, wherein a first impulse response of a combination formed by the partial filter and the rest filter and a second impulse response of a combination formed by the equalization filter and the rest filter each comprises at least an exponential function.

13. Sample rate converter as claimed in claim 2, wherein the equalization filter comprises a Table means having an input and an output, said equalization filter having an input and an output, the input of the equalization filter being coupled to the input of the Table means and the output of the Table means being coupled to the output of the equalization filter.

14. Sample rate converter as claimed in claim 2, wherein a first impulse response of a combination formed by the partial filter and the rest filter and a second impulse response of a combination formed by the equalization filter and the rest filter each comprises at least an exponential function.

15. Sample rate converter as claimed in claim 6, wherein, for each of the first and second impulse responses, a ratio of two consecutive samples of the impulse response is a power of two.

16. Sample rate converter as claimed in claim 2, wherein a combination of the partial filter and the rest filter has a transfer function including at least two imaginary zeros.

* * * * *